(12) United States Patent
Wei

(10) Patent No.: US 12,276,920 B2
(45) Date of Patent: Apr. 15, 2025

(54) METHOD FOR AVOIDING DAMAGE TO OVERLAY METROLOGY MARK

(71) Applicant: Shanghai Huali Integrated Circuit Corporation, Shanghai (CN)

(72) Inventor: Chengchang Wei, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 513 days.

(21) Appl. No.: 17/889,524

(22) Filed: Aug. 17, 2022

(65) Prior Publication Data
US 2023/0161268 A1 May 25, 2023

(30) Foreign Application Priority Data
Nov. 25, 2021 (CN) .......................... 202111409279.5

(51) Int. Cl.
*G03F 7/00* (2006.01)
*G03F 9/00* (2006.01)
*H01L 23/544* (2006.01)

(52) U.S. Cl.
CPC ...... *G03F 7/70633* (2013.01); *G03F 7/70683* (2013.01); *G03F 9/7076* (2013.01); *G03F 9/7084* (2013.01); *H01L 23/544* (2013.01)

(58) Field of Classification Search
CPC ............. G03F 7/70633; G03F 7/70683; G03F 9/7076; G03F 9/7084; H01L 23/544; H01L 22/32; H01L 22/12; H01L 22/26; H10D 64/017; H10D 30/0273; H10D 30/0614
See application file for complete search history.

(56) References Cited

U.S. PATENT DOCUMENTS

2021/0119023 A1* 4/2021 Chiu ................... H01L 21/3065
2021/0257310 A1* 8/2021 Lai ........................ H10D 30/62

* cited by examiner

*Primary Examiner* — Khaja Ahmad
*Assistant Examiner* — Sun Mi Kim King
(74) *Attorney, Agent, or Firm* — Banner & Witcoff, Ltd.

(57) ABSTRACT

The present application provides a method for avoiding a damage to an overlay metrology mark, forming a plurality of raised silicon structures on an active area of a scribe line area on a silicon substrate, forming first to third dielectric layers on the silicon structure, and forming an axial structure of a fin and a spacer on the first to third dielectric layers; forming a shallow trench isolation (STI) area on the silicon substrate between the axial structures; removing a portion of the silicon structure along the height thereof on the scribe line area, the height of the residual silicon structure is 150-300 angstroms higher than that of the STI area; forming a plurality of dummy gates on the residual silicon structure on the scribe line, then applying a dielectric layer to fill a gap between the dummy gates, polishing the dielectric layer to expose the top of the dummy gate.

8 Claims, 4 Drawing Sheets

Step 1. A silicon substrate is provided, the silicon substrate being provided with a scribe line area, a plurality of raised silicon structures are formed on an active area of the scribe line area, first to third dielectric layers are formed on the silicon structure, and then an axial structure of a fin and a spacer attached to the sidewall of the axial structure are formed on the first to third dielectric layers.

Step 2. An STI area is formed on the silicon substrate between the axial structures.

Step 3. A portion of the silicon structure along the height thereof on the scribe line area is removed, wherein the height of the residual silicon structure is 150-300 angstroms higher than that of the STI area.

Step 4. A plurality of dummy gates are formed on the residual silicon structure on the scribe line, then a dielectric layer is applied to fill a gap between the dummy gates, and then the dielectric layer is polished to expose the top of the dummy gate.

Step 5. The dummy gate is removed to form a groove.

Step 6. A metal gate is formed in the groove.

Step 7. The metal gate formed on the residual silicon structure on the scribe line area is used as an overlay metrology mark for metrology of a subsequently formed metal layer.

FIG. 1

METHOD FOR AVOIDING DAMAGE TO OVERLAY METROLOGY MARK

CROSS-REFERENCES TO RELATED APPLICATIONS

This application claims priority to Chinese Patent Application No. 202111409279.5, filed on Nov. 25, 2021, the disclosure of which is incorporated herein by reference in its entirety.

TECHNICAL FIELD

The present application relates to the technical field of semiconductors, in particular to a method for avoiding damage to an overlay metrology mark.

BACKGROUND

An overlay mark (OVL mark) is the key to the accuracy of a lithography process. The overlay marks are generally located in an active area and a shallow trench isolation (STI) area on a scribe line. The overlay marks are used for gate alignment, and damages occur frequently to the overlay marks in the active area and the STI area, which impose a significant impact on FinFET manufacturing. For example, the overlay mark in the active area may fail due to an unclear pattern; and the overlay mark in the STI area may fail due to a film residue.

Therefore, it is necessary to propose a new method to solve the above problem.

BRIEF SUMMARY

In view of the above defect in the prior art, the objective of the present application is to provide a method for avoiding a damage to an overlay metrology mark, so as to solve the problem in the prior art that an overlay mark fails due to a damage to the overlay mark, which results in a decrease in the yield of FinFET products.

In order to achieve the above objective and other related objectives, the present application provides a method for avoiding a damage to an overlay metrology mark, at least including:
  step 1, providing a silicon substrate, the silicon substrate being provided with a scribe line area, forming a plurality of raised silicon structures on an active area of the scribe line area, forming first to third dielectric layers on the silicon structure, and then forming an axial structure of a fin and a spacer attached to the sidewall of the axial structure on the first to third dielectric layers;
  step 2, forming an STI area on the silicon substrate between the axial structures;
  step 3, removing a portion of the silicon structure along the height thereof on the scribe line area, wherein the height of the residual silicon structure is 150-300 angstroms higher than that of the STI area;
  step 4, forming a plurality of dummy gates on the residual silicon structure on the scribe line, then applying a dielectric layer to fill a gap between the dummy gates, and then polishing the dielectric layer to expose the top of the dummy gate;
  step 5, removing the dummy gate to form a groove;
  step 6, forming a metal gate in the groove; and
  step 7, using the metal gate formed on the residual silicon structure on the scribe line area as an overlay metrology mark for metrology of a subsequently formed metal layer.

In some examples, the raised silicon structure in step 1 is a silicon bump to be etched to form a fin structure.

In some examples, a method of forming the dummy gate in step 4 includes: first applying a polysilicon layer, then etching the polysilicon layer to form a plurality of dummy gates, and then applying the dielectric layer to fill the gap between the dummy gates.

In some examples, the dielectric layers in step 4 include fourth to sixth dielectric layers stacked in sequence.

In some examples, the fourth and fifth dielectric layers in step 4 are formed by means of flowable chemical vapor deposition (FCVD).

In some examples, the sixth dielectric layer in step 4 is a high density plasma (HDP) layer.

In some examples, the dummy gate in step 4 is composed of a polysilicon structure and silicon nitride on the polysilicon structure.

In some examples, the dielectric layer is polished by means of chemical mechanical polishing in step 4.

As stated above, the method for avoiding a damage to an overlay metrology mark of the preset application has the following beneficial effects: by combining the preset application with STI and fin cutting processes, a silicon step structure higher than the STI area is formed after the height of the fin on the scribe line is cut, and by forming an overlay mark on the silicon step structure, a damage to the overlay mark caused by oxide layer blocking can be avoided. In addition, in the present application, due to a high ratio of the filling metal gate to the silicon nitride covering it, the problem of an unclear overlay mark pattern on the active area can be avoided.

BRIEF DESCRIPTION OF THE DRAWINGS

FIG. 1 is a flowchart of a method for avoiding damage to an overlay metrology mark in the preset application.

DETAILED DESCRIPTION OF THE DISCLOSURE

The embodiments of the present application are described below using specific examples, and those skilled in the art can easily understand other advantages and effects of the present application from the contents disclosed in the Description. The present application can also be implemented or applied using other different specific embodiments, and various details in the Description can also be modified or changed based on different viewpoints and applications without departing from the spirit of the present application.

Please refer to FIGS. 1-7. It should be noted that the drawings provided in this embodiment are only used to illustrate the basic concept of the present application in a schematic way, so the drawings only show the components related to the present application rather than being drawn according to the number, shape, and size of the components in actual implementation. The type, number, and proportion of various components can be changed randomly during actual implementation, and the layout of components may be more complicated.

The present application provides a method for avoiding damage to an overlay metrology mark. Referring to FIG. 1, FIG. 1 is a flowchart of the method for avoiding damage to an overlay metrology mark in the preset application. The method at least includes the following steps.

Figure 2:
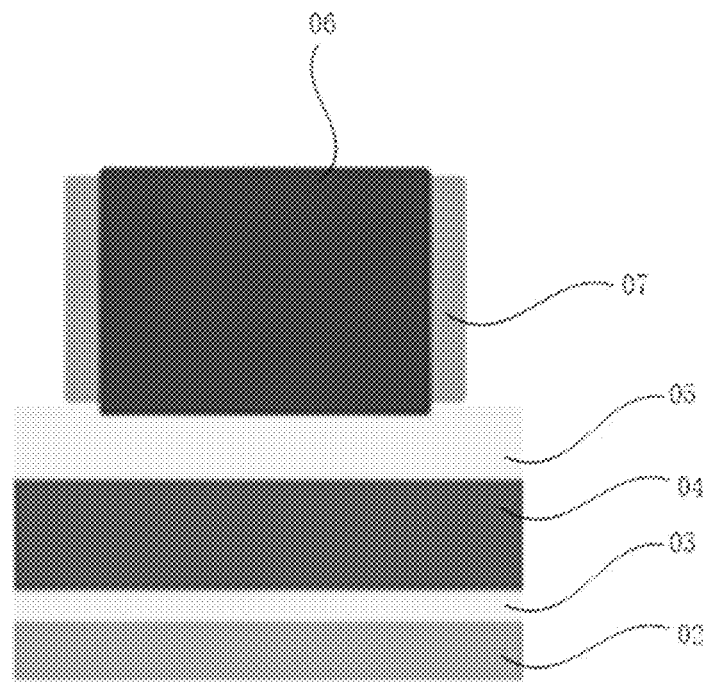
FIG. 2 is a schematic structural diagram of first to third dielectric layers formed on a silicon structure, as well as an axial structure of a fin and a spacer in the preset application.

Step 1. A silicon substrate is provided, the silicon substrate being provided with a scribe line area, a plurality of raised silicon structures are formed on an active area of the scribe line area, first to third dielectric layers are formed on the silicon structure, and then an axial structure of a fin and a spacer attached to the sidewall of the axial structure are formed on the first to third dielectric layers. Referring to FIG. 2, FIG. 2 is a schematic structural diagram of the first to third dielectric layers formed on the silicon structure, as well as the axial structure of the fin and the spacer in the preset application. In step 1, the silicon substrate is provided with the scribe line area, the plurality of raised silicon structures 02 are formed on the active area of the scribe line area, the first dielectric layer 03, the second dielectric layer 04, and the third dielectric layer 05 are formed on the silicon structure 02, and then the axial structure 06 of the fin and the spacer 07 attached to the sidewall of the axial structure 06 are formed on the first to third dielectric layers.

In this embodiment of the present application, the raised silicon structure in step 1 is a silicon bump to be etched to form a fin structure.

Figure 3:
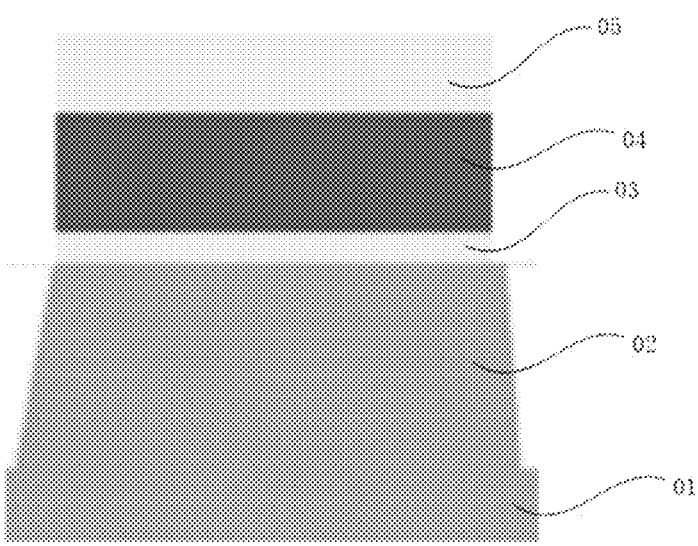
FIG. 3 is a schematic structural diagram of forming an STI area on a silicon substrate between the axial structures.

Step 2. An STI area is formed on the silicon substrate between the axial structures. Referring to FIG. 3, FIG. 3 is a schematic structural diagram of forming the STI area on the silicon substrate between the axial structures. In step 2, the STI area 01 is formed on the silicon substrate between the axial structures. The STI area is located in an area below the upper surface of the silicon substrate. FIG. 3 is a front view of the silicon bump (silicon structure 02), from which it can be seen that the STI area is located below the silicon structure 02. It can be seen from a side view that the STI area is actually located below the upper surface of the silicon substrate between the axial structures.

Figure 4:
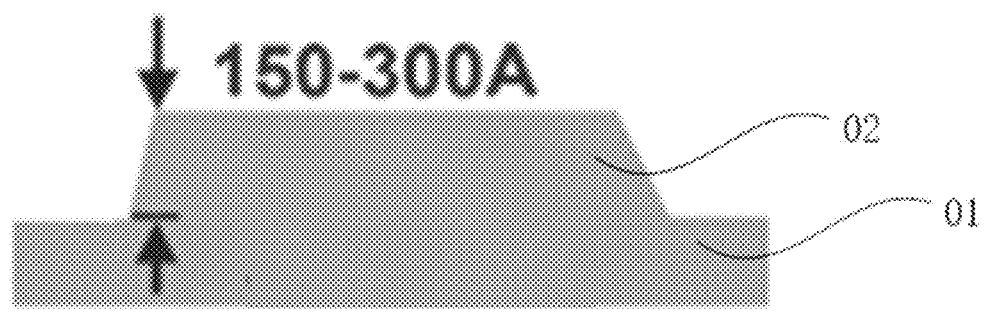
FIG. 4 is a schematic structural diagram of removing a portion of the silicon structure along the height thereof.

Step 3. A portion of the silicon structure along the height thereof on the scribe line area is removed, wherein the height of the residual silicon structure is 150-300 angstroms higher than that of the STI area. Referring to FIG. 4, FIG. 4 is a schematic structural diagram of removing the portion of the silicon structure along the height thereof. In step 3, the portion of the silicon structure along the height thereof on the scribe line area is removed, wherein the height of the residual silicon structure 02 is 150-300 angstroms higher than that of the STI area 01.

Figure 5:
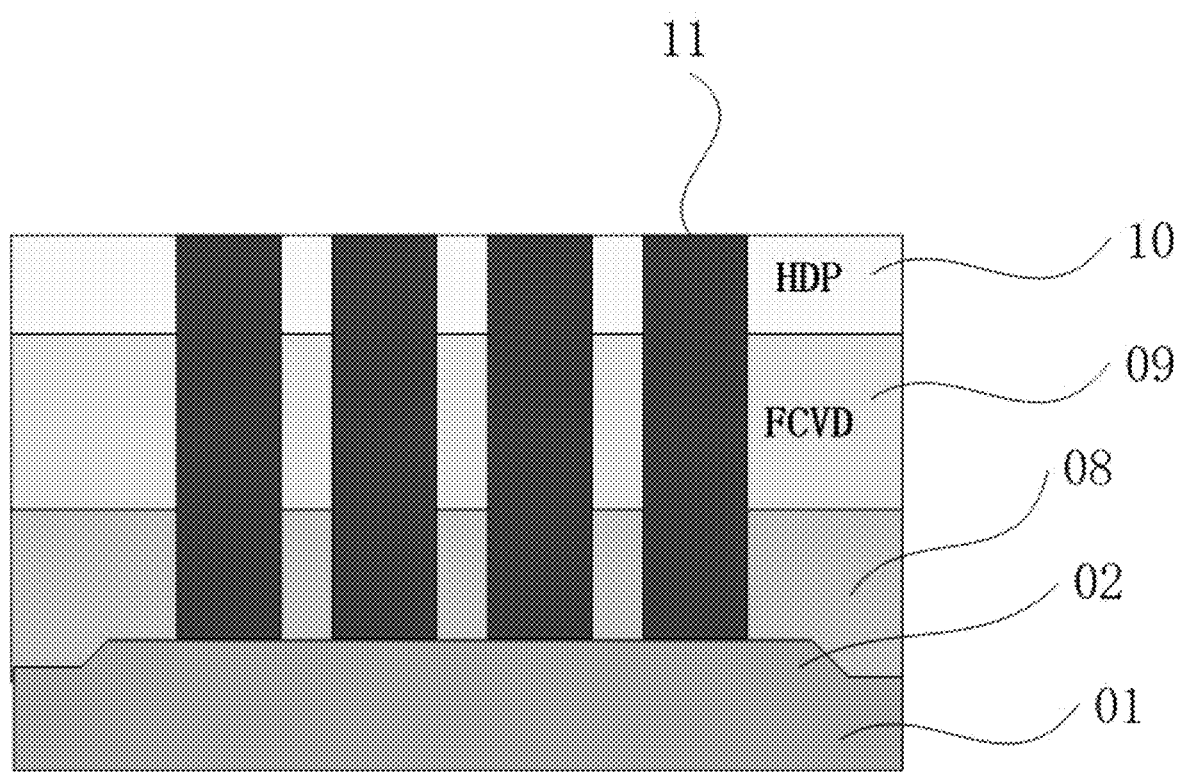
FIG. 5 is a schematic structural diagram of forming a dummy gate in the present application.

Step 4. A plurality of dummy gates are formed on the residual silicon structure on the scribe line, then a dielectric layer is applied to fill a gap between the dummy gates, and then the dielectric layer is polished to expose the top of the dummy gate. Referring to FIG. 5, FIG. 5 is a schematic structural diagram of forming the dummy gate in the present application. In step 4, the plurality of dummy gates 11 are formed on the residual silicon structure 02 on the scribe line, then the dielectric layer is applied to fill the gap between the dummy gates 11, and then the dielectric layer is polished to expose the top of the dummy gate.

In this embodiment of the present application, a method of forming the dummy gate 11 in step 4 includes: first applying a polysilicon layer, then etching the polysilicon layer to form a plurality of dummy gates, and then applying the dielectric layer to fill the gap between the dummy gates.

In this embodiment of the present application, the dielectric layers in step 4 include a fourth dielectric layer 08, a fifth dielectric layer 09, and a sixth dielectric layer 10 stacked in sequence.

In this embodiment of the present application, the fourth and fifth dielectric layers in step 4 are formed by means of FCVD.

In this embodiment of the present application, the sixth dielectric layer 10 in step 4 is an HDP layer.

In this embodiment of the present application, the dummy gate in step 4 is composed of a polysilicon structure and silicon nitride on the polysilicon structure.

In this embodiment of the present application, the dielectric layer is polished by means of chemical mechanical polishing in step 4.

Figure 6:
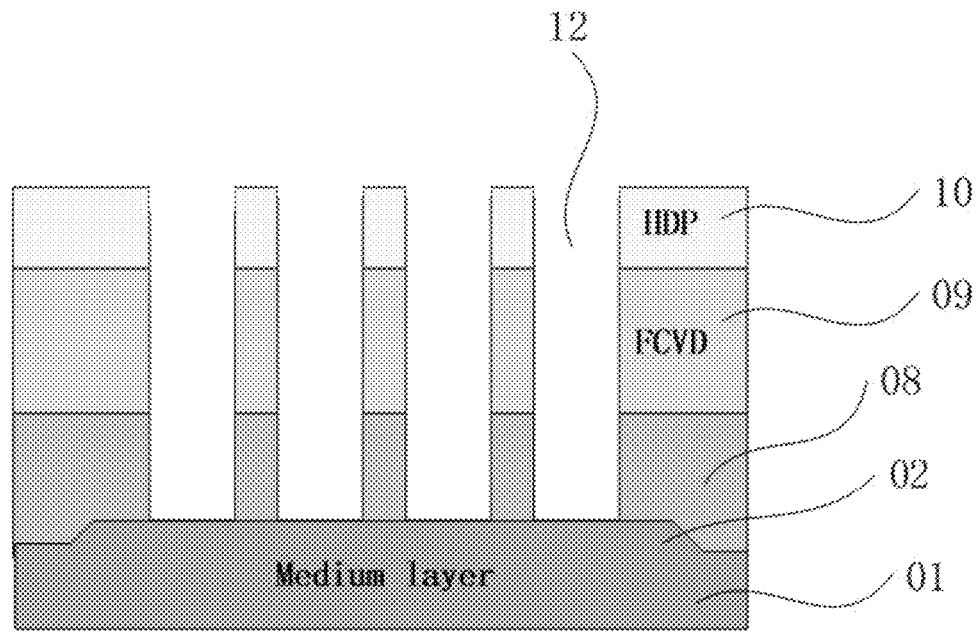
FIG. 6 is a schematic structural diagram of removing the dummy gate in the present application.

Step 5. The dummy gate is removed to form a groove. Referring to FIG. 6, FIG. 6 is a schematic structural diagram of removing the dummy gate in the present application. In step 5, the dummy gate is removed to form the groove 12.

Figure 7:
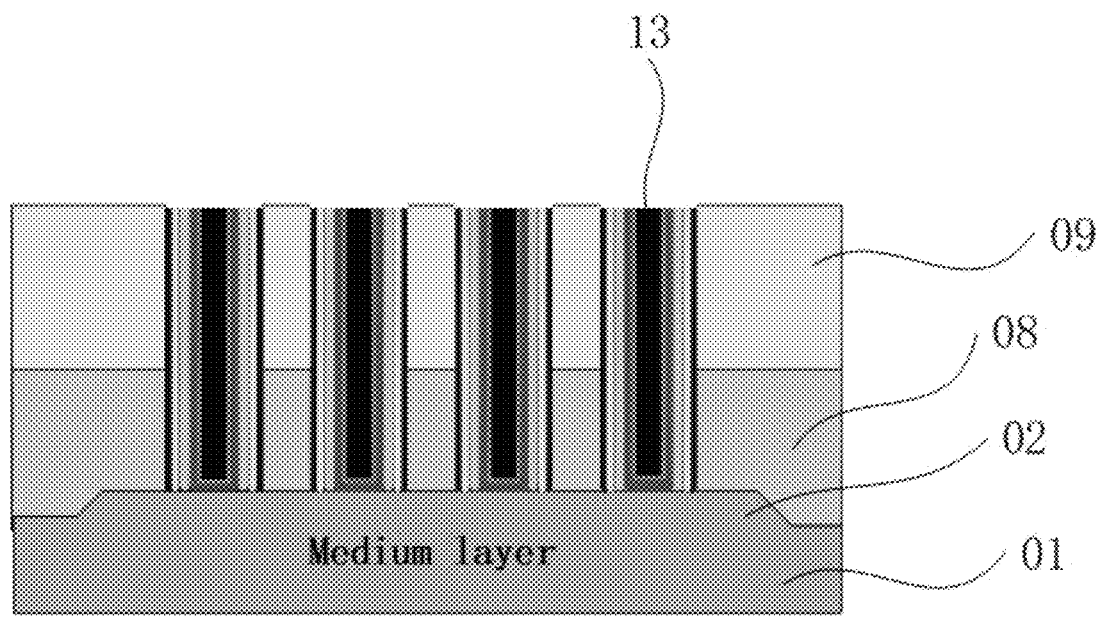
FIG. 7 is a schematic structural diagram of forming a metal gate in a groove in the present application.

Step 6. A metal gate is formed in the groove. Referring to FIG. 7, FIG. 7 is a schematic structural diagram of forming the metal gate in the groove in the present application. In step 6, the metal gate 13 is formed in the groove 12.

Step 7. The metal gate formed on the residual silicon structure on the scribe line area is used as an overlay metrology mark for metrology of a subsequently formed metal layer. That is, the metal gate formed on the residual silicon structure with a height of 150-300 angstroms (higher than the height of the STI area) on the scribe line is used as an overlay accuracy metrology mark, which is used to measure an alignment accuracy of the metal layer (first metal layer) formed after the gate is formed.

To sum up, by combining the preset application with STI and fin cutting processes, a silicon step structure higher than the STI area is formed after the height of the fin on the scribe line is cut, and by forming an overlay mark on the silicon step structure, a damage to the overlay mark caused by oxide layer blocking can be avoided. In addition, in the present application, due to a high ratio of the filling metal gate to the silicon nitride covering it, the problem of an unclear overlay mark pattern on the active area can be avoided. Therefore, the present application effectively overcomes various defects in the prior art and has high industrial utilization value.

The above embodiment merely illustrates the principle and effect of the present application, rather than limiting the present application. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A method for avoiding damage to an overlay metrology mark, at least comprising:
   step 1, providing a silicon substrate, the silicon substrate being provided with a scribe line area, forming a plurality of raised silicon structures on an active area of the scribe line area, forming first to third dielectric layers on the silicon structure, and then forming an axial structure of a fin and a spacer attached to a sidewall of the axial structure on the first to third dielectric layers;
   step 2, forming a shallow trench isolation (STI) area on the silicon substrate between the axial structures;
   step 3, removing a portion of the silicon structure along a height thereof on the scribe line area, wherein a height of the residual silicon structure is 150-300 angstroms higher than that of the STI area;
   step 4, forming a plurality of dummy gates on the residual silicon structure on the scribe line, then applying a dielectric layer to fill a gap between the dummy gates, and then polishing the dielectric layer to expose a top of the dummy gate;
   step 5, removing the dummy gate to form a groove;
   step 6, forming a metal gate in the groove; and
   step 7, using the metal gate formed on the residual silicon structure on the scribe line area as an overlay metrology mark for metrology of a subsequently formed metal layer.

2. The method for avoiding damage to the overlay metrology mark according to claim 1, wherein the raised silicon structure in step 1 is a silicon bump to be etched to form a fin structure.

3. The method for avoiding damage to the overlay metrology mark according to claim 1, wherein a method of forming the dummy gate in step 4 comprises: first applying a polysilicon layer, then etching the polysilicon layer to form a plurality of dummy gates, and then applying the dielectric layer to fill the gap between the dummy gates.

4. The method for avoiding damage to the overlay metrology mark according to claim 3, wherein the dielectric layers in step 4 comprise fourth to sixth dielectric layers stacked in sequence.

5. The method for avoiding damage to the overlay metrology mark according to claim 4, wherein the fourth and fifth dielectric layers in step 4 are formed by means of flowable chemical vapor deposition (FCVD).

6. The method for avoiding damage to the overlay metrology mark according to claim 4, wherein the sixth dielectric layer in step 4 is a high density plasma (HDP) layer.

7. The method for avoiding damage to the overlay metrology mark according to claim 4, wherein the dummy gate in step 4 is composed of a polysilicon structure and silicon nitride on the polysilicon structure.

8. The method for avoiding damage to the overlay metrology mark according to claim 1, wherein the dielectric layer is polished by means of chemical mechanical polishing in step.

* * * * *